United States Patent [19]

Kumada et al.

[11] Patent Number: 4,724,393
[45] Date of Patent: Feb. 9, 1988

[54] SURFACE POTENTIAL DETECTOR

[75] Inventors: Akira Kumada; Michihiro Murata, both of Nagaokakyo, Japan

[73] Assignee: Murata Manufacturing Co., Ltd., Japan

[21] Appl. No.: 929,410

[22] Filed: Nov. 10, 1986

[30] Foreign Application Priority Data

Nov. 12, 1985 [JP] Japan .............................. 60-254411
Jan. 14, 1986 [JP] Japan .................................. 61-6089

[51] Int. Cl.$^4$ ......................... G01R 5/28; G01R 29/12
[52] U.S. Cl. .................................... 324/458; 324/72; 324/109; 324/132; 324/140 D
[58] Field of Search .......... 324/109, 457, 458, 140 R, 324/140 D, 72, 132; 355/14 CH; 364/483, 571

[56] References Cited

U.S. PATENT DOCUMENTS 4,205,267  5/1980  Williams ............................... 324/72
4,222,007  9/1980  Comstock .......................... 324/458
4,614,908  9/1986  Daniele et al. ................. 355/14 CH Primary Examiner—Ernest F. Karlsen
Attorney, Agent, or Firm—Ostrolenk, Faber, Gerb & Soffen

[57] ABSTRACT

A surface potential detector of a non-contact type which comprises first and second detecting electrodes arranged in a separated manner from a measured surface so that charge variations are induced on the first and second detecting electrodes on the basis of the potential of the measured surface. The surface potential detector further comprises apparatus for making the amounts of charge variations induced on the first and second detecting electrodes different from each other, first and second detecting devices respectively detecting the amounts of charge variations induced on the first and second detecting electrodes and correction apparatus for performing arithmetic on the ratio between the outputs from the first and second detecting devices to correct the output of the first or second detecting devices on the basis of the ratio.

16 Claims, 24 Drawing Figures

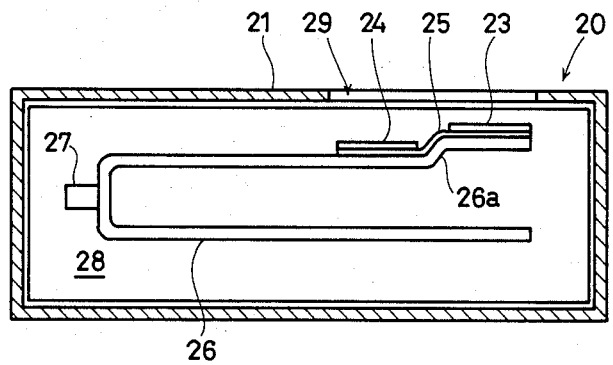
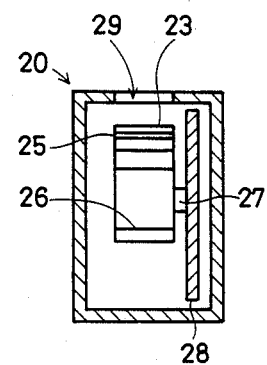
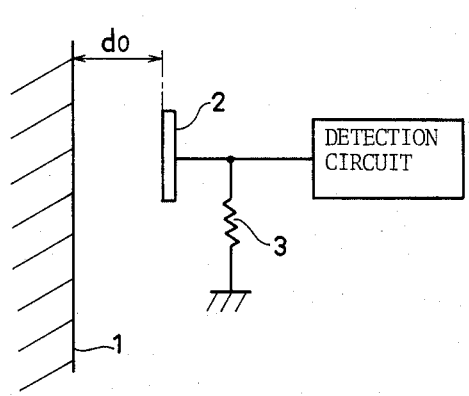
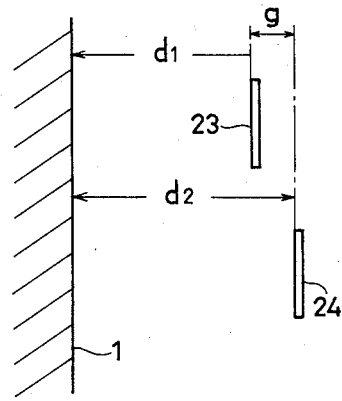

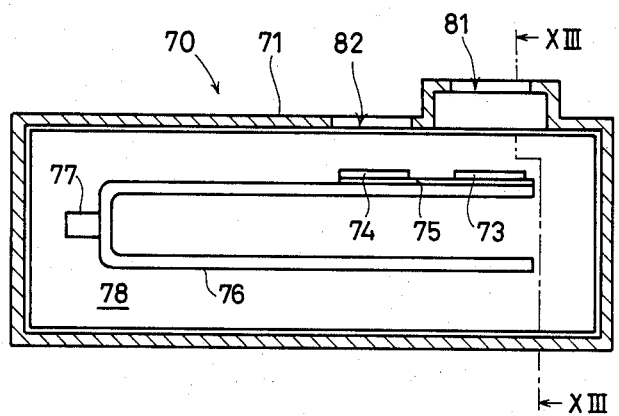
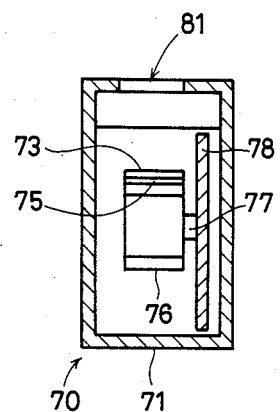
FIG.12  FIG.13
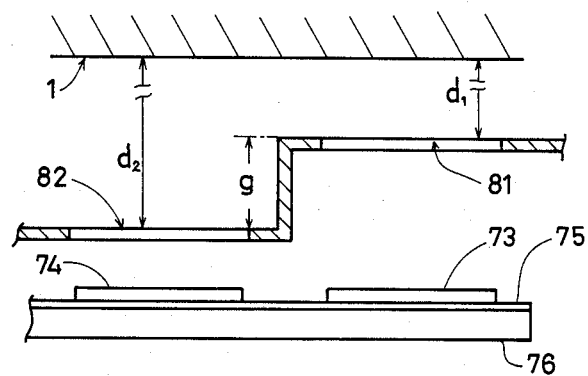
FIG.14

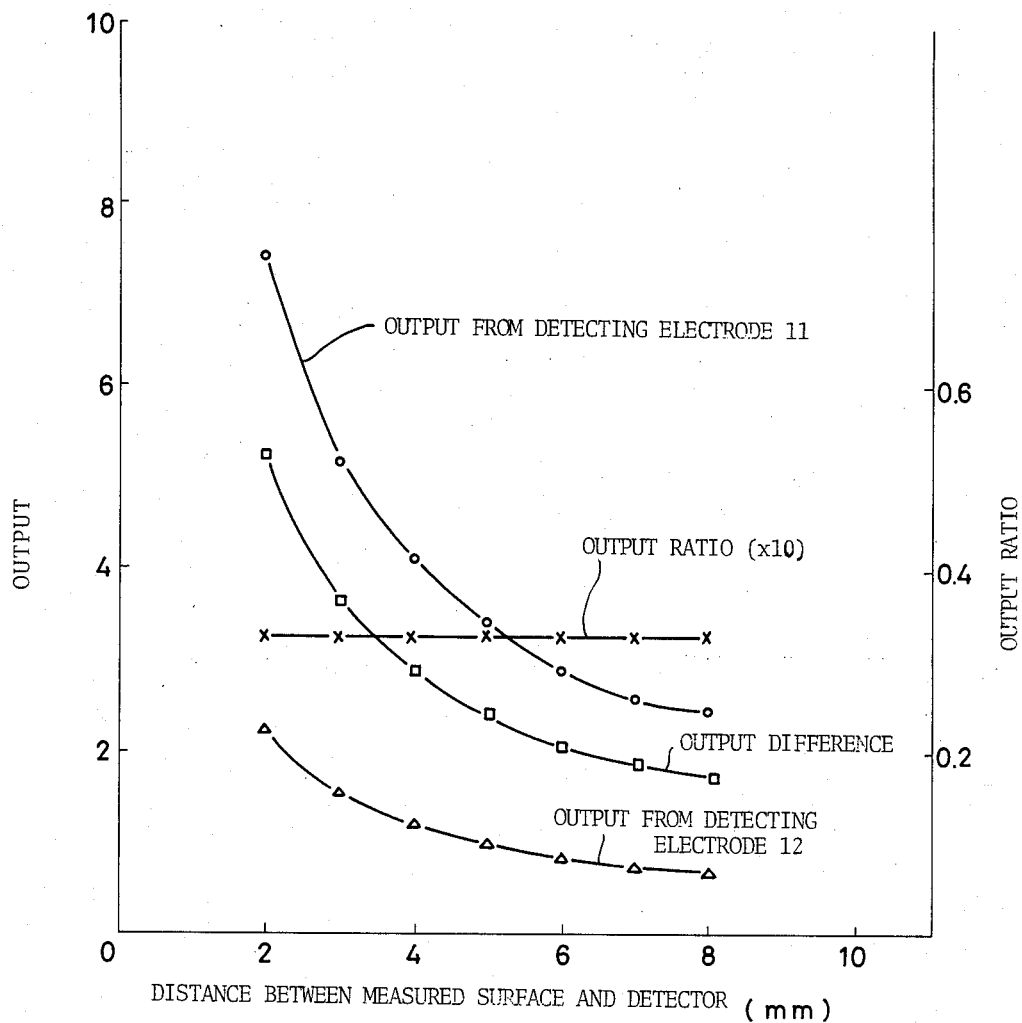

SURFACE POTENTIAL DETECTOR

BACKGROUND OF THE INVENTION

1. Field of the Invention

The present invention relates to an apparatus for detecting the surface potential of an object in a non-contact manner, and more particularly, it relates to a surface potential detector which can reduce output variation caused by variation in the set distance between a measured surface and the detector.

2. Description of the Prior Art

A chopper type or a vibrating reed type detector is well known in the art as an apparatus for detecting the potential of a surface to be measured in a non-contact manner. In either type of detector, an amount of lines of electric force formed between a measured surface and detecting electrodes are changed to detect the potential of the measured surface on the basis of variation in charges induced on the detecting electrodes. When the distance between the measured surface and the detector is varied, therefore, the amount of the lines of electric force is varied whereby the output of the detector is inevitably changed.

Thus, various correction means have been proposed in the art in order to correct such output change based on the variation in distance between the measured surface and the detector.

FIG. 20 shows the structure of a conventional surface potential detector which is disclosed in Japanese Patent Laying-Open Gazette No. 152959/1985. Referring to FIG. 20, the conventional surface potential detector is provided with first and second detecting electrodes 6 and 7 which are different in distance from a measured surface 1 to obtain output difference between the first and second detecting electrodes 6 and 7, thereby to correct the measuring output on the basis of the output difference.

As shown in FIG. 20, a window 8a of a prescribed configuration is formed in a case 8 in order to guide lines X of electric force from the measured surface 1. Namely, the window 8a is provided as a single part while the detecting electrodes 6 and 7 are provided in plural, and hence the lines X of electric force reach the detecting electrodes 6 and 7 through the same window 8a, as typically shown in FIG. 21.

Such structure is also applicable to a vibrating reed type surface potential detector in such a manner that, as typically shown in FIG. 22, first and second detecting electrodes 11 and 12 are provided to be different in distance from a measured surface 1, so that the detector output can be corrected on the basis of output difference between the detecting electrodes 11 and 12.

In such a surface potential detector provided with the detecting electrodes 6 and 7 or 11 and 12 different in distance from the measured surface 1, however, the output difference between the two detecting electrodes is the function of the distance in practice. Therefore, it is not possible to obtain correct output with completely corrected distance by the correction method utilizing the output difference between two detecting electrodes. In other words, the output difference between the detecting electrodes 11 and 12 is not constant, as shown in FIG. 23.

SUMMARY OF THE INVENTION

Accordingly, an object of the present invention is to provide a surface potential detector which can effectively reduce output variation based on variation in set distance between the detector and a measured surface without requiring complicated structure.

The surface potential detector according to the present invention is adapted to detect the surface potential of an object in a non-contact manner, and the present invention is applicable to various types of surface potential detectors such as the so-called chopper type and vibrating reed type ones.

According to a wide aspect of the present invention, provided is a surface potential detector which comprises first and second detecting electrodes arranged to face a measured surface in a separated manner, vibration means provided in relation to the first and second detecting electrodes for periodically changing the distances between the measured surface and the first and second detecting electrodes or areas in which the first and second detecting electrodes face the measured surface thereby to induce charge variations on the first and second detecting electrodes, means for making the amounts of charge variations on the detecting electrodes based on the potential of the measured surface different from each other, first and second detecting means electrically connected with the first and second detecting electrodes for extracting the charge variations induced on the detecting electrodes in the form of electric signals and correction means connected with the first and second detecting means to perform arithmetic on the output ratio between the detecting means thereby to correct the outputs from the first and second detecting means on the basis of the said output ratio.

The means for making the charge variations induced on the detecting electrodes based on the potential of the measured surface different from each other can be formed by means for making distances between the first and second detecting electrodes and the measured surface different from each other.

Alternatively, the surface potential detector may further include a case containing the first and second detecting electrodes and having first and second windows for making lines of electric force from the measured surface incident upon the detecting electrodes so that the said means for making the charge variations on the detecting electrodes different from each other is formed by the first and second windows, which are arranged in such deviation that the same are different in distance from the measured surface from each other.

According to the present invention, first and second detecting electrodes are so arranged to be different in distance from a measured surface from each other or first and second windows are provided in a case so that the same are different in distance from the measured surface from each other, as obvious from the following detailed description of the preferred embodiments. Further provided is correction means for obtaining the output ratio between the detecting electrodes thereby to correct the measuring output, so that it is possible to obtain output which is not easily influenced by variation in set distance between the measured surface and the surface potential detector. Thus, complicated operation is not required for aligning/adjusting the surface potential detector in use with respect to the measured surface. Further, the surface potential detector according to the present invention requires no complicated correction circuit to be connected with the detecting electrodes, whereby the surface potential detector, particularly the detecting electrodes may not be increased in size. Thus, the surface potential detector can be readily installed in an extremely narrow space such as the vicinity of a photosensitive drum of a copying machine.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a front sectional view schematically showing a surface potential detector according to an embodiment of the present invention;

FIG. 2 is a side sectional view of the surface potential detector as shown in FIG. 1;

FIGS. 3 and 4 are partial sectional views for illustrating the principle of correction according to the present invention;

FIGS. 12 and 13 are a front sectional view and a side sectional view taken along the line XIII—XIII of FIG. 12 showing a surface potential detector according to a fourth embodiment of the present invention;

FIG. 14 is an enlarged sectional view for illustrating the principle of correction in the fourth embodiment of the present invention;

FIG. 23 illustrates relation between the outputs of respective detecting electrodes and the set distance between the surface potential detector and the measured surface in the prior art example as shown in FIG. 22.

DESCRIPTION OF THE PREFERRED EMBODIMENTS

Figure 5:
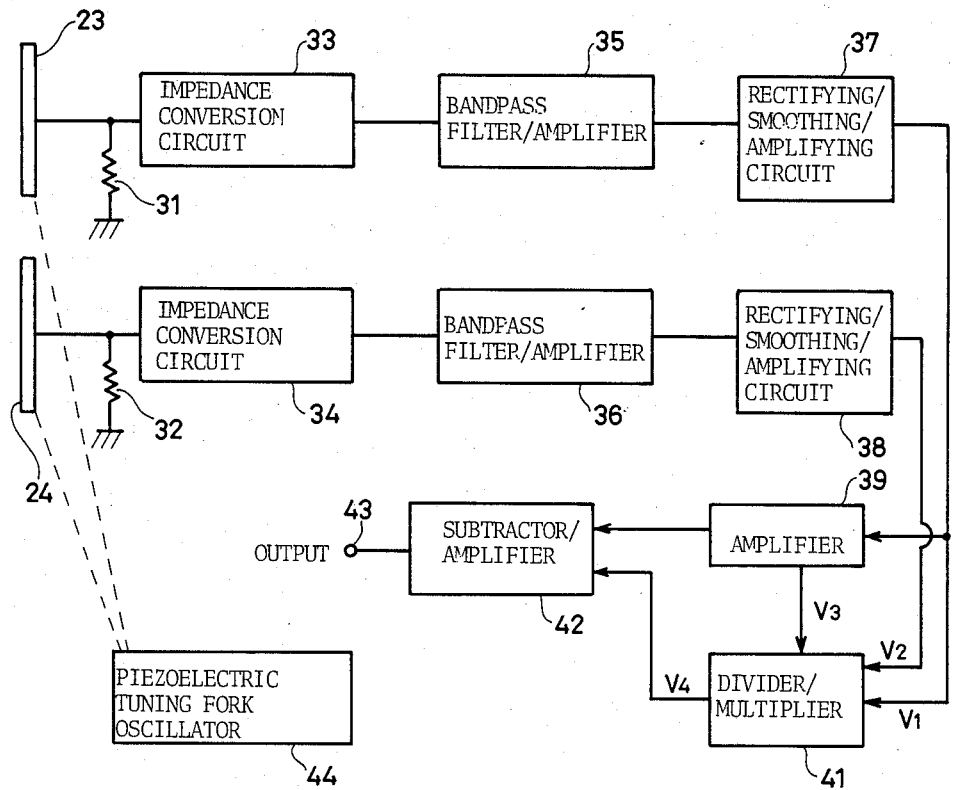
FIG. 5 is a block diagram of the embodiment as shown in FIG. 1.

FIGS. 1 and 2 show a vibrating reed type surface potential detector 20 according to a first embodiment of the present invention. This surface potential detector 20 comprises a conductive case 21 which contains a first detecting electrode 23 and a second detecting electrode 24. The first and second detecting electrodes 23 and 24 are formed on a flexible substrate 25. The flexible substrate 25 is adhered to one leg portion of a piezoelectric tuning fork 26 serving as vibration means by, e.g., silicone adhesive. The piezoelectric tuning fork 26 is fixed to an insulating substrate 28 through a support member 27. On the other hand, the conductive case 21 is provided with a window 29 in correspondence to the detecting electrodes 23 and 24.

In this embodiment, one leg portion of the piezoelectric tuning fork 26 has a step 26a in its forward end. The first and second detecting electrodes 23 and 24 are adhered on the flexible substrate 25 and separated through the step 26a. Thus, the first and second detecting electrodes 23 and 24 are arranged in deviation by a distance g (refer to FIG. 4 as hereinafter described) to be different from each other in distance from a measured object (not shown) arranged externally in front of the window 29. According to this embodiment, the first and second detecting electrodes 23 and 24 are arranged in the aforementioned manner, to correct output variation based on the distance between the surface potential detector 20 and the measured surface, on the basis of the following principle.

Principle of Correction in the Surface Potential Detector according to the First Embodiment:

Consider the output of a vibrating reed type surface potential detector as shown in FIG. 3, for example. Assuming that $d_0$ represents the distance between a measured surface 1 and a detecting electrode 2, $2\Delta d$ represents the amplitude of the detecting electrode 2 and $C_0$ represents a capacitance between the measured surface 1 and the detecting electrode 2 at the distance therebetween $= d_0$, while $V_{hv}$ represents the potential of the measured surface 1 and R represents the value of a current-voltage transfer resistor 3 connected between the detecting electrode 2 and a reference potential, where $\alpha = \Delta d/d_0$, voltage $V_{OUT}$ generated on both ends of the resistor 3 by vibration $\Delta d \sin \omega t$ of the detecting electrode 2 is expressed as follows:

$$V_{OUT} = -C_0 \cdot V_{hv} \cdot R \cdot \alpha \cdot \omega \cdot \cos \omega t/(1+\alpha \sin \omega t)^2 \quad (1)$$

On the other hand, the first and second detecting electrodes 23 and 24 of the surface potential detector according to this embodiment are arranged in deviation by the distance g as shown in FIG. 4, whereby the same are separated from the measured surface by different distances $d_1$ and $d_2$. Thus, when the first and second detecting electrodes 23 and 24 are driven in a phase, the outputs based on the detecting electrodes 23 and 24 are expressed as follows:

$$V_{OUT1} = -C_{10} \cdot V_{hv} \cdot R_1 \cdot \alpha_1 \cdot \omega \cdot \cos \omega t/(1+\alpha_1 \sin \omega t)^2 \quad (2)$$

$$V_{OUT2} = -C_{20} \cdot V_{hv} \cdot R_2 \cdot \alpha_2 \cdot \omega \cdot \cos \omega t/(1+\alpha_2 \sin \omega t)^2 \quad (3)$$

Assuming that $\beta$ represents the AC-to-DC conversion ratio in rectification of the outputs $V_{OUT1}$ and $V_{OUT2}$, the rectified outputs $|V_{OUT}|$ are expressed as follows:

$$|V_{OUT1}| = C_{10}V_{hv}R_1\alpha_1\omega\beta_1 \quad (4)$$

$$|V_{OUT2}| = C_{20}V_{hv}R_2\alpha_2\omega\beta_2 \quad (5)$$

The ratio $\gamma$ of $|V_{OUT1}|$ to $|V_{OUT2}|$ is expressed as follows:

$$\gamma = |V_{OUT1}|/|V_{OUT2}| = C_{10}V_{hv}R_1\alpha_1\omega\beta_1/(C_{20}V_{hv}R_2\alpha_2\omega\beta_2) \quad (6)$$

$$= \frac{C_{10}R_1\alpha_1\beta_1}{C_{20}R_2\alpha_2\beta_2} = \frac{C_{10}R_1\beta_1\Delta d_1 d_2}{C_{20}R_2\beta_2\Delta d_2 d_1} = C_\gamma R_\gamma \beta_\gamma \Delta d_\gamma (d_2/d_1)$$

where $$C_\gamma = C_{10}/C_{20}, \quad R_\gamma = R_1/R_2$$

$$B_\gamma = B_1/B_2, \quad \Delta d_\gamma = \Delta d_1/\Delta d_2$$

Relation between electrostatic capacity and the surface area of a detecting electrode is $C = \epsilon S/d$, and $C_\gamma$ in the expression (6) can be transformed into the form of $S_{65} = S_1/S_2$. Further, $d_2 = d_1 + g$, and hence the expression (6) can be expressed as follows:

$$\gamma = R_\gamma \cdot S_\gamma \cdot \beta_\gamma \cdot \Delta d_\gamma \left(1 + \frac{g}{d_1}\right)^2 \quad (7)$$

As obvious from the expression (7), when the first and second detecting electrodes 23 and 24 are formed on the same vibration means, the output ratio of the first detecting electrode 23 to the second detecting electrode is the function of only $d_1$ since $\Delta d_\gamma$ is always constant, and hence the change of $\gamma$ caused by variation of $d_1$ can be expressed as follows:

$$\frac{d\gamma}{dd_1} = -2R_\gamma \cdot S_\gamma \cdot \beta_\gamma \cdot \Delta d_\gamma \frac{g(d_1 + g)}{d_1^3} \leq 0 \quad (8)$$

As obvious from the above expressions (7) and (8), the ratio $\gamma$ can be found without being influenced by changes in the amplitude of the detecting electrodes 23 and 24 and the potential of the measured surface 3, while the same is the function of the distances between the measured surface 1 and the detecting electrodes 23 and 24 (distance between the measured surface 1 and the first detecting electrode 23 in the expression (7)).

Therefore, it is understood that detecting output independent of the distances between the detecting electrodes 23 and 24 and the measured surface 1 can be obtained by utilizing the value $\gamma$ depending only on the distances from the measured surface 1.

Thus, the first and second detecting electrodes 23 and 24, being in deviation to be different in distance from the measured surface 1 from each other, are employed as shown in FIGS. 1 and 2, to dissolve distance dependency of the measuring output. FIG. 5 is a schematic block diagram showing the circuit part of the embodiment as shown in FIGS. 1 and 2, which is formed on the basis of the aforementioned principle of correction.

Although the first and second detecting electrodes 23 and 24 are shown in an aligned manner in FIG. 5, the same are provided in deviation by the distance g in practice, as shown in FIG. 4. Current-voltage conversion resistors 31 and 32 are connected between the detecting electrodes 23 and 24 and a reference potential (ground potential in this embodiment). The resistors 31 and 32 partially define first and second detecting means for extracting charge variations induced on the surfaces of the detecting electrodes 23 and 24 in the form of voltage. The detecting means for the first detecting electrode 23 includes an impedance conversion circuit 33, a bandpass filter/amplifier 35 and a rectifying/smoothing/amplifying circuit 37 connected in the rear stages of the resistor 31. Similarly the detecting means for the second detecting electrode 24 includes an impedance conversion circuit 34, a bandpass filter/amplifier 36 and a rectifying/smoothing/amplifying circuit 38 sequentially connected in the rear stages of the resistor 32.

The aforementioned structure is similar to that of a conventional vibrating reed type surface potential detector with respect to each one of the detecting electrodes 23 and 24.

Figure 6:
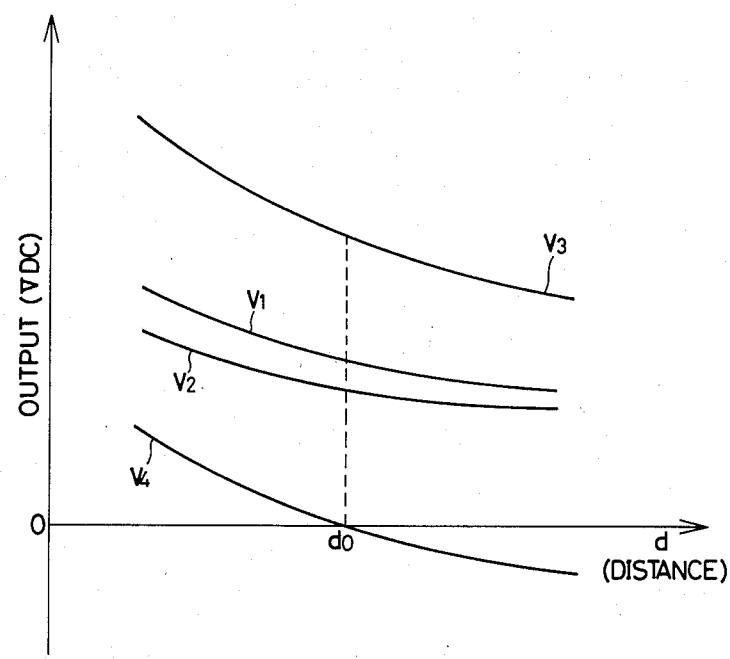
FIG. 6 illustrates relation between outputs derived from respective detecting electrodes of a surface potential detector formed on the basis of the embodiment as shown in FIG. 1 and the distance between a measured surface and the surface potential detector.

In the surface potential detector of this embodiment, an amplifier 39 is connected to the output side of the rectifying/smoothing/amplifying circuit 37 in order to obtain measuring output on the basis of the first detecting electrode 23. Further, a divider/multiplier 41 and a subtractor/amplifier 42 are connected to the rear stages of the respective rectifying/smoothing/amplifying circuits 37 and 38 as correction means for performing correction on the basis of the aforementioned principle of correction. Namely, the output $V_1$ of one rectifying/smoothing/amplifying circuit 37 is divided to be supplied to the divider/multiplier 41 in addition to the amplifier 39. The divider/multiplier 41 is supplied with output $V_2$ of the other rectifying/smoothing/amplifying circuit 38, i.e., the output derived from the second detecting electrode 24. FIG. 6 shows relation between the output $V_1$ and the distance between the detecting electrode and the measured surface, and relation between the output $V_2$ and the distance. The divider/multiplier 41 obtains the ratio between the outputs $V_1$ and $V_2$ supplied from the rectifying/smoothing/amplifying circuits 37 and 38 while multiplying the same by output $V_3$ supplied from the amplifier 39, to output $V_4 = V_1/V_2 \times V_3$. The correction output $V_4$ is supplied to the subtractor/amplifier 42, which is also supplied with the output $V_3$ from the amplifier 39. The subtractor/amplifier 42 subtracts the correction output $V_4$ from the measuring output $V_3$ while supplying an output terminal 43 with the measuring output independent of distance variation.

The first and second detecting electrodes 23 and 24 are fixedly provided on a vibrator such as a piezoelectric tuning fork, and a piezoelectric tuning fork oscillator 44 is adapted to drive the piezoelectric tuning fork.

Further, the detecting electrodes 23 and 24 may be fixedly provided on the same piezoelectric vibrator, or may be fixed on separate vibrators. In this case, it is necessary to stabilize the amplitudes of the two vibrators in order to make $\Delta d\gamma$ appearing in the aforementioned expression (8) constant.

In the surface potential detector of the embodiment as shown in FIG. 5, the detection output $V_1$ derived from the first detecting electrode 23 is on the one hand supplied to the amplifier 39 as measuring output while being supplied to the divider/multiplier 41 on the other hand. Similarly, the detection output $V_2$ derived from the other detecting electrode 24 is supplied to the divider/multiplier 41 for performing arithmetic on correction output. Thus, the divider/multiplier 41 first obtains $V_1/V_2$, i.e., $\gamma$ in the aforementioned expression (7). Then the divider/multiplier 41 multiplies the same by the output $V_3$ supplied from the amplifier 39, to perform arithmetic on the correction output $V_4 = \gamma \times V_3$. FIG. 6 shows relation between the correction output $V_4$ and the distances between the detecting electrodes and the measured surface. FIG. 6 also shows the relation between the measuring output $V_3$ supplied to the subtractor/amplifier 42 from the amplifier 39 and the distances between the detecting electrodes and the measured surface.

As obvious from the relation between $V_3$ and $V_4$ and the distance d as shown in FIG. 6, constant output $V_{OUT}$ can be obtained regardless of distance variation between the detecting electrodes and the measured surface by performing arithmetic of $V_3 - V_4$.

Figure 7:
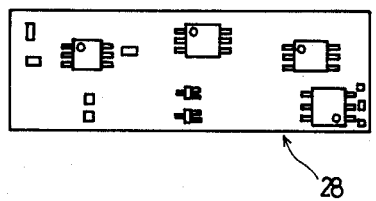
FIG. 7 is a plan view showing a circuit substrate packaged with first and second detecting means and correction means.

In the structure as shown in FIGS. 1 and 2, the respective circuits forming the first and second detecting means and the amplifier 39, the divider/multiplier 41 and the subtractor/amplifier 42 etc. are preferably provided on a single circuit substrate 28 as shown in FIG. 7, to simplify the structure of the surface potential detector 20 and reduce the size thereof.

Figure 8:
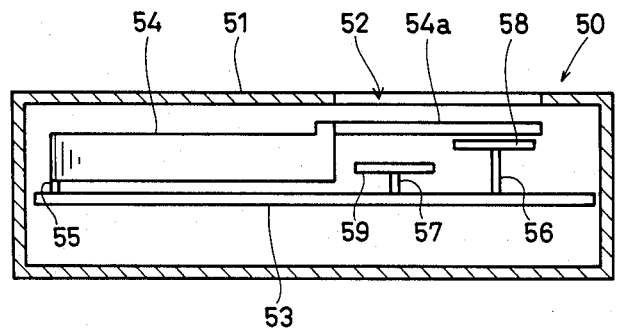
FIGS. 8 and 9 are front and side sectional views of a surface potential detector according to a second embodiment of the present invention.
Figure 9:
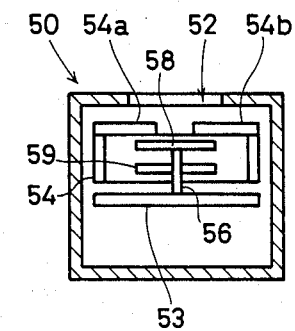

FIGS. 8 and 9 show a second embodiment of the present invention. A surface potential detector 50 according to the second embodiment comprises a conductive case 51 provided with a window 52. The conductive case 51 contains a substrate 53 packaged with circuits forming the aforementioned respective detecting and correction means. A piezoelectric tuning fork 54 serving as a vibration means is mounted on the substrate 53 through a support member 55.

On the other hand, support legs 56 and 57 of insulating material and being different in length from each other are upwardly provided on the substrate 53 and first and second detecting electrodes 58 and 59 are fixed to the forward ends of the support legs 56 and 57. The support legs 56 and 57 are made to be different in length so that the first and second detecting electrodes 58 and 59 are different in height as shown in FIGS. 8 and 9. Thus, the first and second detecting electrodes 58 and 59 are arranged to be different in distance from a measured surface (not shown) arranged in front of the window 52, similarly to the structure as shown in FIG. 1.

Choppers 54a and 54b are fixed to the forward end of the piezoelectric tuning fork 54. According to the second embodiment, therefore, the choppers 54a and 54b are periodically moved in parallel with the surfaces of the detecting electrodes 58 and 59 by the piezoelectric tuning fork 54 so that the areas of the detecting electrodes 58 and 59 facing the measured surface are periodically changed, whereby charge variations are induced on the detecting electrodes 58 and 59.

In the so-called chopper type surface potential detector 50 as shown in FIGS. 8 and 9, distance dependency of the output is corrected in the following manner.

Principle of Correction in the So-Called Chopper Type Surface Potential Detector:

In the aforementioned surface potential detector of the so-called chopper type, the capacitance between the measured surface and the detecting electrodes is expressed as follows:

$$C = C_0(1 + \alpha \sin \omega t) \tag{9}$$

where $C_0$ represents the capacitance in the case where the distance between the measured surface and the detecting electrodes is $d_0$ and $\alpha$ represents the maximum value of the amount of change in capacitance determined by the amplitude of vibration means such as a piezoelectric tuning fork.

Figure 9A:
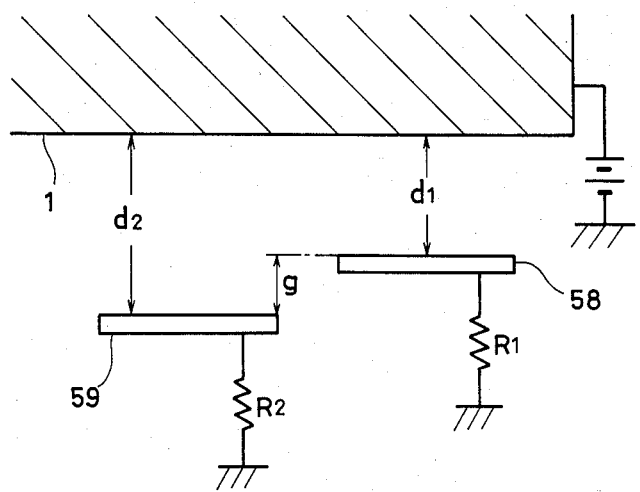
FIG. 9A is a partially enlarged sectional view for illustrating the principle of correction in the second embodiment of the present invention.

In the surface potential detector 50 of this embodiment, on the other hand, the first and second detecting electrodes 58 and 59 are arranged in deviation by the distance g as shown in FIG. 9A, to be separated from the measured surface 1 by different distances $d_1$ and $d_2$ respectively. Therefore, when the first and second detecting electrodes 58 and 59 are driven in phase, capacitances $C_1$ and $C_2$ based on the detecting electrodes 58 and 59 are expressed by the following expressions (10) and (11), where $S_1$ and $S_2$ represent areas of the surfaces of the first and second detecting electrodes 58 and 59 facing the measured surface 1:

$$C_1 = C_{01}(1 + \alpha_1 \sin \omega t) \tag{10}$$
$$= \epsilon \frac{S_1}{d_1}(1 + \alpha_1 \sin \omega t)$$

$$C_2 = \epsilon \frac{S_2}{d_2}(1 + \alpha_2 \sin \omega t) \tag{11}$$

Referring to FIG. 9A, currents $i_1$ and $i_2$ flowing through resistors $R_1$ and $R_2$ are expressed as follows:

$$i_1 = \frac{dQ_1}{dt} \tag{12}$$
$$= \frac{d}{dt} C_1 \cdot V_{hv}$$
$$= \epsilon \frac{S_1}{d_1} V_{hv} \alpha_1 \omega \cos \omega t$$

$$i_2 = \epsilon \frac{S_2}{d_2} \cdot V_{hv} \cdot \alpha_2 \omega \cos \omega t \tag{13}$$

Assuming that $V_1$ and $V_2$ represent the levels of voltage generated at the resistors $R_1$ and $R_2$ and $\beta_1$ and $\beta_2$ represent coefficients in case of rectifying respective voltage signals, the ratio $\gamma$ of $V_1$ to $V_2$ is expressed as follows:

$$\gamma = \frac{\beta_1 i_1 R_1}{\beta_2 i_2 R_2} = \frac{\beta_1 d_2 S_1 \alpha_1}{\beta_2 d_1 S_2 \alpha_2} = \frac{\beta_1 S_1 \alpha_1}{\beta_2 S_2 \alpha_2}\left(1 + \frac{g}{d_1}\right) \tag{14}$$

Therefore, when all of $\beta_1$, $\beta_2$, $S_1$, $S_2$, $\alpha_1$, $\alpha_2$ and g are constants, the ratio $\gamma$ is the function of only $d_1$. Thus, it is understood that the output variation based on the variation of the distance $d_1$ (or $d_2$) can be corrected by employing the aforementioned value $\gamma$.

Also in the chopper type surface potential detector 50 as shown in FIGS. 8 and 9, the output variation based on variation in distance between the detector 50 and the measured surface can be corrected on the basis of the aforementioned principle of correction. In this case, the first and second detecting means connected with the respective detecting electrodes 58 and 59 and the correction means can be implemented by the circuits as shown in FIG. 5, and the description with reference to FIG. 5 is applied to this embodiment.

Figure 10:
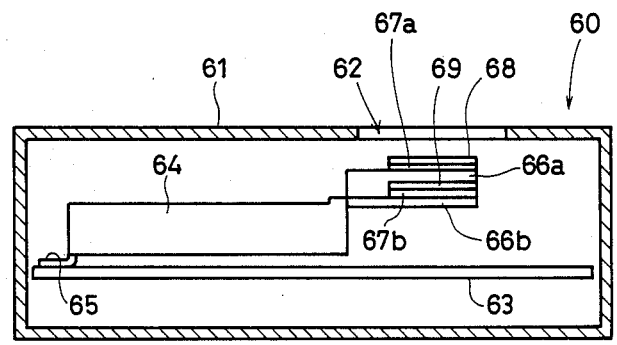
FIGS. 10 and 11 are front and side sectional views showing a surface potential detector according to a third embodiment of the present invention.
Figure 11:
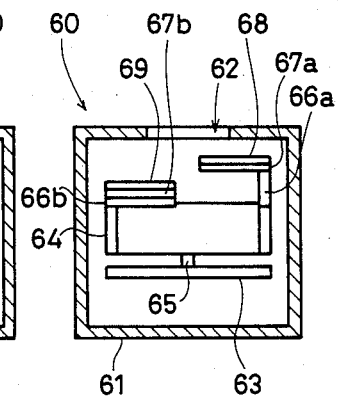

FIGS. 10 and 11 are sectional views showing a third embodiment of the present invention. A surface potential detector 60 according to this embodiment comprises a conductive case 61 and a window 62 formed therein. The conductive case 61 is provided therein with a circuit substrate 63 packaged with the aforementioned first and second detecting means and correction means, and a piezoelectric tuning fork 64 is mounted on the circuit substrate 63 through a support member 65. First and second detecting electrodes 68 and 69 are fixed to both forward end portions of the piezoelectric tuning fork 64 through support members 66a and 66b and insulators 67a and 67b. The support members 66a and 66b are different in height as shown in FIGS. 10 and 11, so that the first and second detecting electrodes 68 and 69 are in deviation to be different in distance from a measured surface (not shown).

In the surface potential detector 60 of this embodiment, the first and second detecting electrodes 68 and 69 are vibrated by the piezoelectric tuning fork 64 in the surface directions thereof. Thus, periodically changed is the amount of lines of electric force from the measured surface (not shown) incident upon the detecting electrodes 68 and 69 through the window 62 so that the areas of the regions of the detecting electrodes 68 and 69 facing the measured surface (not shown) are periodically changed. Thus, charge variations based on the potential of the measured surface are induced on the respective detecting electrodes 68 and 69 similarly to the case of the chopper type surface potential detector 50 as shown in FIGS. 8 and 9.

Also in this embodiment, the first and second detecting electrodes 68 and 69 are arranged to be different in distance from the measured surface, whereby output variation based on variation in the distance between the surface potential detector 60 and the measured surface can be corrected in accordance with the aforementioned expressions (9) to (14).

In the structure of the following embodiments, first and second detecting electrodes are not provided to be different in distance from a measured surface, but first and second windows shaped on a case corresponding to first and second detecting electrodes are provided in such deviation that the first and second windows are different in distance from a measured surface. Through study on the result of FIG. 23 as hereinabove described, the inventors have considered that, even if the distance between a surface potential detector and a measured surface is changed, the output ratio between detecting electrodes is substantially constant (even if the detecting electrodes are provided in deviation), and hence the outputs of the detecting electrodes are not substantially influenced even if the same are provided at the back of case windows to be separated from the said windows, to reach the following embodiments.

Namely, in consideration of the fact that the number of lines of electric force incident upon the detecting electrodes through the windows is mainly influenced by positional relation between the measured surface and the case windows, first and second windows are provided in correspondence to respective ones of first and second detecting electrodes to be in such deviation that the first and second windows are different in distance from a measured surface.

The first and second windows are arranged in deviation as hereinabove described, whereby outputs obtained by the first and second detecting electrodes are different in level from each other in the following embodiments, while the outputs of the detecting electrodes are also different in change rate following variation in set distance between the measured surface and the surface potential detector. Thus, the output for distance correction responsive to distance variation between the measured surface and the surface potential detector can be provided by obtaining the output ratio between the first and second detecting electrodes, similarly to the case of the aforementioned embodiments.

While the aforementioned embodiments are based on such consideration that the lines of electric force incident upon the detecting electrodes are determined by the distances between the measured surface and the detecting electrodes, the following embodiments are based on such consideration that the number of lines of electric force incident upon detecting electrodes is determined by positional relation between a measured surface and windows provided in a case.

FIGS. 12 and 13 are sectional views showing a fourth embodiment of the present invention, which is based on the aforementioned supposition. A surface potential detector 70 comprises a conductive case 71 containing first and second detecting electrodes 73 and 74. The first and second detecting electrodes 73 and 74 are formed on a flexible substrate 75, for example, polyimide film. The flexible substrate 75 is adhered to one leg portion of a piezoelectric tuning fork 76 serving as vibration means by silicone adhesive, for example. The piezoelectric tuning fork 76 is fixed to an insulating substrate 78 through a support member 77.

On the other hand, the conductive case 71 is provided with first and second windows 81 and 82 in correspondence to the first and second detecting electrodes 73 and 74. As obvious from FIG. 12 and FIG. 14 showing a principal part of FIG. 12 in an enlarged manner, the windows 81 and 82 are provided in deviation by a distance g. Therefore, distances $d_1$ and $d_2$ between the windows 81 and 82 and a measured surface 1 are in the relation of $|d_1 - d_2| = g$. This distance g is selected to be about 1.0 mm when the windows 81 and 82 are about 3.4×3.5 mm in size, for example.

As hereinabove described, the output variation based on the set distance between the measured surface and the surface potential detector is corrected on the basis of the difference in distance between the windows 81 and 82 and the measured surface 1 in this embodiment, in place of the difference in distance between the detecting electrodes and the measured surface. Therefore, first and second detecting means and correction means can be formed by circuits identical to those shown in FIG. 5, and the description with reference to FIG. 5 is applied to this embodiment. The first and second detecting means and the correction means are packaged on the aforementioned insulating substrate 78.

Figure 15:
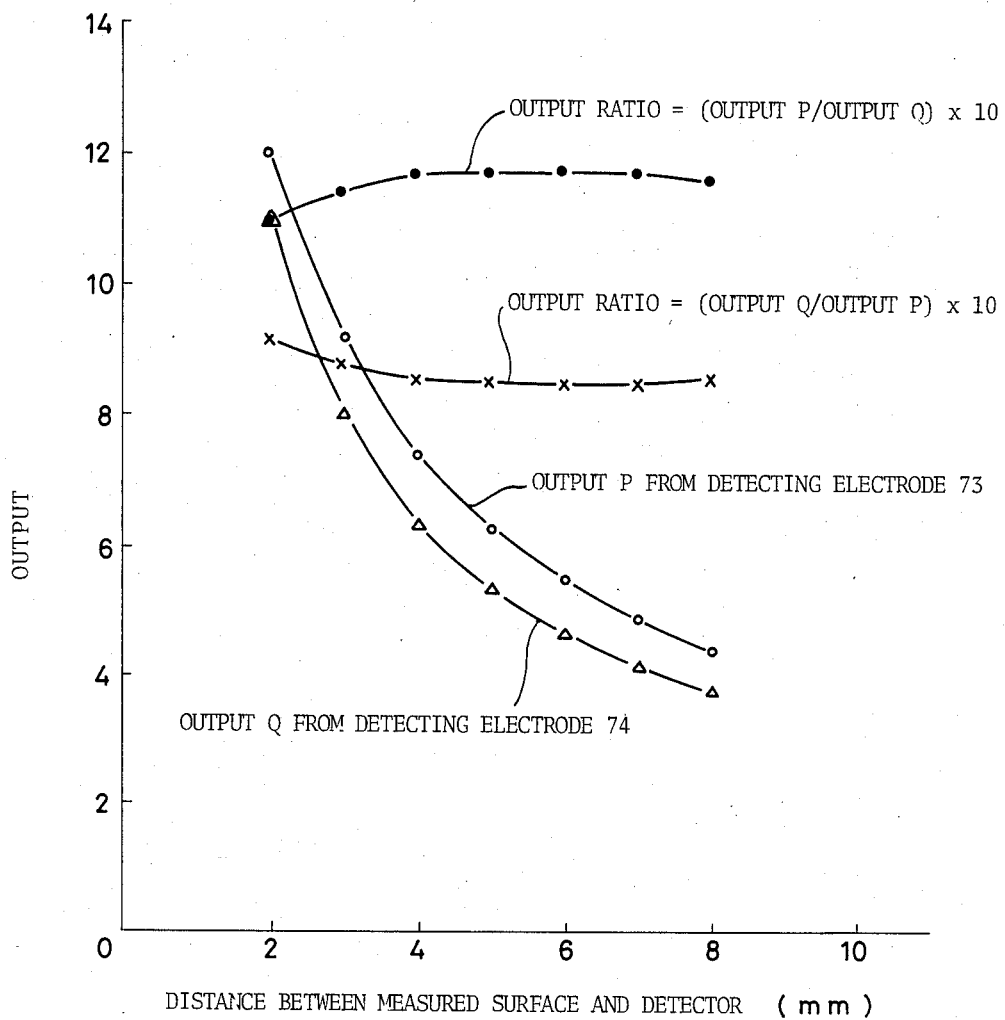
FIG. 15 illustrates relation between outputs derived from respective detecting electrodes in a surface potential detector formed in accordance with the fourth embodiment of the present invention and the distance between a measured surface and the detector.

Description is now made on the results of definite experiments. Signals obtained by the first and second detecting electrodes 73 and 74 are sine waves of about 0.5 mV$_{rms}$ per surface potential 100 V when the distance between the first window 81 and the measured surface 1 is 3.0 mm. The frequency is equal to the vibration frequency of the piezoelectric tuning fork 76, which is 800 Hz in this embodiment. FIG. 15 shows the values of the amplified detection signals per surface potential 100 V and distance correction output obtained by respective rectified detection signals.

As obvious from FIG. 15, the output ratio is extremely changed when the distance between the measured surface and the surface potential detector (with reference to the second window part 82) is within a range of 2 to 4 mm. Thus, the distance correction output as obtained is multiplied by an appropriate number to be added to or subtracted from one of the outputs derived from the first and second detecting electrodes 73 and 74, to obtain output independent of variation in the set distance between the measured surface and the surface potential detector.

The performance of the addition or subtraction depends on the output of the detecting electrode processed as a denominator for obtaining the output ratio between the first and second detecting electrodes 73 and 74.

Figure 16:
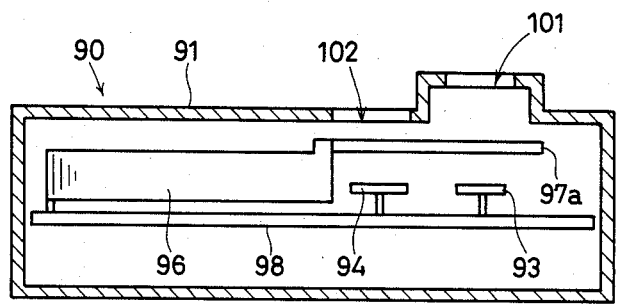
FIGS. 16 and 17 the front and side sectional views showing a surface potential detector according to a fifth embodiment of the present invention.
Figure 17:
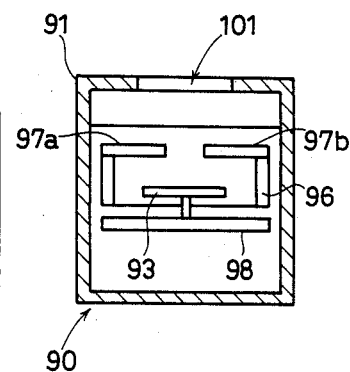

The standpoint of the embodiment as shown in FIGS. 12 and 13 is also applicable to the so-called chopper type surface potential detector. FIGS. 16 and 17 illustrate a fifth embodiment of such case. Referring to FIGS. 16 and 17, a surface potential detector 90 comprises a conductive case 91 which is provided with first and second windows 101 and 102 different in distance from a measured surface. In correspondence to the first and second windows 101 and 102, first and second detecting electrodes 93 and 94 are arranged in the conductive case 91. Choppers 97a and 97b are fixed to the forward end of a piezoelectric tuning fork 96, which is fixed to a circuit substrate 98. The coppers 97a and 97b are adapted to function similarly to the choppers 54a and 54b of the embodiment as shown in FIGS. 8 and 9, to induce AC charges based on the surface potential of the measured surface on the detecting electrodes 93 and 94. Also in this embodiment, the windows 101 and 102 are in deviation to obtain output for distance correction responsive to distance variation between the measured surface and the surface potential detector through the output difference between the detecting electrodes 93 and 94 based on difference in distance between the windows 101 and 102 and the measured surface.

Figure 18:
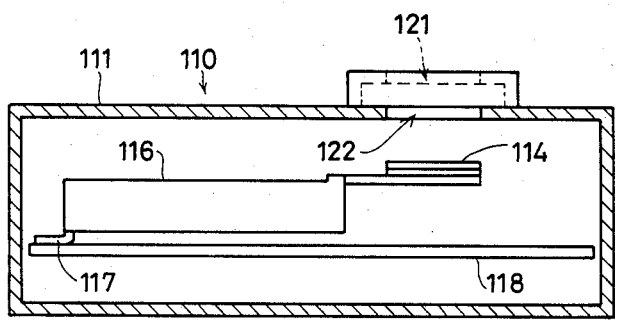
FIGS. 18 and 19 are front and side sectional views of a surface potential detector according to a sixth embodiment of the present invention.
Figure 19:
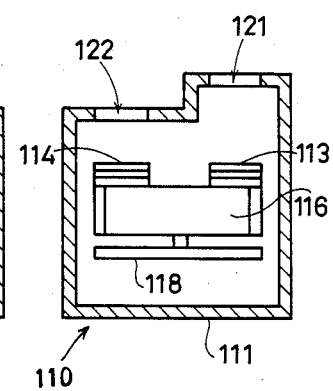
Figure 20:
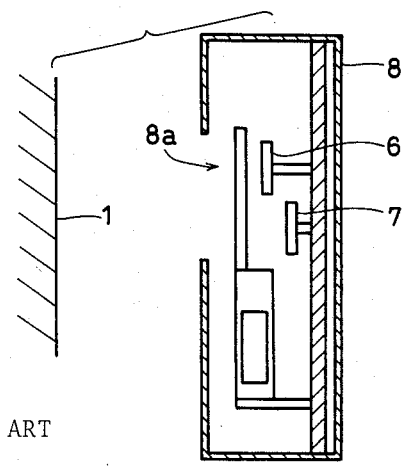
FIG. 20 is a sectional view showing an example of a conventional surface potential detector.
Figure 21:
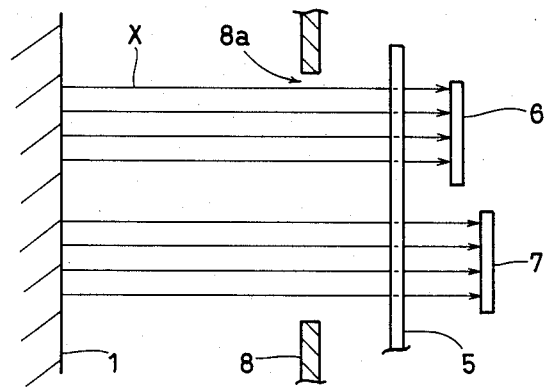
FIG. 21 is a sectional view for illustrating states of lines of electric force formed between a measured surface and detecting electrodes in the surface potential detector as shown in FIG. 20.
Figure 22:
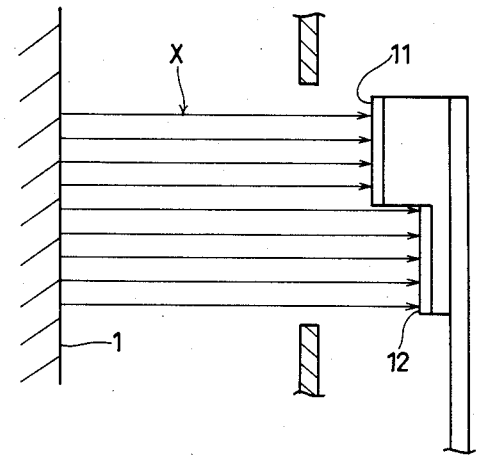
FIG. 22 is a sectional view showing correction means in another example of a conventional surface potential detector.

FIGS. 18 and 19 are sectional views showing a sixth embodiment of the present invention. A surface potential detector 110 according to this embodiment comprises a conductive case 111 provided with first and second windows 121 and 122 different in distance from a measured surface (not shown). In correspondence to the window parts 121 and 122, first and second detecting electrodes 113 and 114 are provided in the conductive case 111. The first and second detecting electrodes 113 are fixed through a support member 117 to a piezoelectric tuning fork 116, which is mounted on a circuit substrate 118. Thus, similarly to the case of the embodiment as shown in FIGS. 10 and 11, the first and second detecting electrodes 113 and 114 are vibrated by the piezoelectric tuning fork 116 in the surface directions thereof, whereby the areas of surfaces of the detecting electrodes 113 and 114 facing the measured surface are periodically changed to induce AC charges based on the potential of the measured surface on the detecting electrodes 1113 and 114. Thus, the output of the surface potential detector 110 can be corrected through the outputs of the detecting electrodes 113 and 114 based on the difference in the distances between the respective windows 121 and 122 and the measured surface, similarly to the embodiment as shown in FIGS. 12 and 13.

Although the first and second detecting electrodes are fixed to the same piezoelectric tuning fork in the aforementioned embodiments, the same may be fixed to separate piezoelectric tuning forks. In this case, the output ratio between the two detecting electrodes are calculated after rectifying the respective outputs. The vibration means for vibrating the detecting electrodes is not restricted to the piezoelectric tuning fork, but may be implemented by an I-shaped or H-shaped piezoelectric tuning member or an electromagnetic vibrator.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface potential detector for detecting the surface potential of an object in a non-contact manner, said detector comprising:
    first and second detecting electrodes arranged to face a measured surface in a separated manner from said measured surface;
    vibration means provided in relation to said first and second detecting electrodes to periodically change distances between said measured surface and said first and second detecting electrodes or areas in which said measured surface and said first and second detecting electrodes face each other, thereby to induce charge variation on said first and second detecting electrodes;
    means for making amounts of charge variation on said detecting electrodes based on the potential of said measured surface different from each other;
    first and second detecting means electrically connected with said first and second detecting electrodes to extract said charges induced on said detecting electrodes in the form of electric signals; and
    correction means connected with said first and second detecting means for performing arithmetic on the ratio between output signals from said first and second detecting means to correct the output of said first or second detecting means on the basis of said ratio.

2. A surface potential detector in accordance with claim 1, wherein said means for making said amounts of charge variation on said detecting electrodes based on the potential of said measured surface different from each other is adapted to make said first and second detecting electrodes different in distance from said measured surface.

3. A surface potential detector in accordance with claim 1, further comprising a case containing said first and second detecting electrodes and being provided with first and second windows for making lines of electric force from said measured surface incident upon said detecting electrodes,
    said means for making said amounts of charge variation on said detecting electrodes based on the potential of said measured surface different from each other being said first and second windows arranged in deviation to be different in distance from said measured surface.

4. A surface potential detector in accordance with claim 1, wherein said correction means comprises:
    a divider electrically connected with said first and second detecting means to perform arithmetic on the ratio between output signals from said first and second detecting means,
    a multiplier electrically connected with said first or second detecting means and said divider to perform arithmetic on correction output by multiplying the output of said divider by the output of said first or second detecting means, and a subtractor electrically connected with said first or second detecting means and said multiplier for subtracting said correction output from the output of said first or second detecting means.

5. A surface potential detector in accordance with claim 1, wherein said first and second detecting means include impedance conversion circuits connected with said first and second detecting electrodes.

6. A surface potential detector in accordance with claim 2, wherein said vibration means includes a piezoelectric tuning fork.

7. A surface potential detector in accordance with claim 6, wherein said first and second detecting electrodes are fixed to said piezoelectric tuning fork.

8. A surface potential detector in accordance with claim 7, wherein respective said detecting electrodes are fixed to said piezoelectric tuning fork so that distances between respective said detecting electrodes and said measured surface are periodically changed following vibration of said piezoelectric tuning fork.

9. A surface potential detector in accordance with claim 7, further including a case containing said first and second detecting electrodes and being provided with a window for making lines of electric force from said measured surface incident upon said first and second detecting electrodes, respective said detecting electrodes being fixed to said piezoelectric tuning fork so that areas of said detecting electrodes overlapped with said window are periodically changed following vibration of said piezoelectric tuning fork whereby areas of respective said detecting electrodes facing said measured surface are periodically changed.

10. A surface potential detector in accordance with claim 6, further including choppers mounted on said piezoelectric tuning fork, respective said detecting electrodes being so arranged that areas of said detecting electrodes facing said measured surface are periodically changed by said choppers.

11. A surface potential detector in accordance with claim 3, wherein said vibration means includes a piezoelectric tuning fork.

12. A surface potential detector in accordance with claim 11, wherein said first and second detecting electrodes are fixed to said piezoelectric tuning fork.

13. A surface potential detector in accordance with claim 12, wherein respective said detecting electrodes are so fixed to said piezoelectric tuning fork that distances between respective said detecting electrodes and said measured surface are periodically changed with vibration of said piezoelectric tuning fork.

14. A surface potential detector in accordance with claim 12, wherein respective said detecting electrodes are so fixed to said piezoelectric tuning fork that areas of respective said detecting electrodes overlapped with first and second windows are periodically changed with vibration of said piezoelectric tuning fork whereby areas of said detecting electrodes facing said measured surface are periodically changed.

15. A surface potential detector in accordance with claim 11, further including choppers mounted on said piezoelectric tuning fork, respective said detecting electrodes being so arranged in said case that areas of said detecting electrodes facing said measured surface are periodically changed by said choppers.

16. A surface potential detector in accordance with claim 1, wherein said first and second detecting means and said correction means are packaged on a single substrate.

* * * * *